United States Patent
Ahn et al.

(10) Patent No.: US 10,057,988 B2
(45) Date of Patent: Aug. 21, 2018

(54) MULTILAYER CAPACITOR AND BOARD HAVING THE SAME

(71) Applicant: SAMSUNG ELECTRO-MECHANICS CO., LTD., Suwon-si, Gyeonggi-do (KR)

(72) Inventors: Young Ghyu Ahn, Suwon-si (KR); Byoung Hwa Lee, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/467,686

(22) Filed: Mar. 23, 2017

(65) Prior Publication Data

US 2018/0020545 A1 Jan. 18, 2018

(30) Foreign Application Priority Data

Jul. 13, 2016 (KR) .................. 10-2016-0088481

(51) Int. Cl.
*H01G 4/228* (2006.01)
*H05K 1/18* (2006.01)
(Continued)

(52) U.S. Cl.
CPC ............ *H05K 1/181* (2013.01); *H01G 4/012* (2013.01); *H01G 4/018* (2013.01); *H01G 4/248* (2013.01);
(Continued)

(58) Field of Classification Search
CPC .......... H01G 4/005; H01G 4/01; H01G 4/012; H01G 4/232; H01G 4/248; H01G 4/30;
(Continued)

(56) References Cited

U.S. PATENT DOCUMENTS

| 6,104,599 A * | 8/2000 | Ahiko | ............... H01G 4/012 361/306.3 |
| 2013/0050897 A1* | 2/2013 | Kim | ............... H01G 4/12 361/321.2 |

(Continued)

FOREIGN PATENT DOCUMENTS

JP H10-289837 A 10/1998
JP 2004-228514 A 8/2004
(Continued)

OTHER PUBLICATIONS

Office Action issued in corresponding Korean Application No. 10-2016-0088481, dated Jul. 3, 2017; with English translation.

*Primary Examiner* — Chau N Nguyen
*Assistant Examiner* — Roshn Varghese
(74) *Attorney, Agent, or Firm* — McDermott Will & Emery LLP

(57) ABSTRACT

A multilayer capacitor and a board having the same includes external electrodes and internal electrodes. The external electrodes include connection portions formed on a mounting surface of a capacitor body and band portions formed on side surfaces of the capacitor body, and the internal electrodes include body portions overlapping each other and lead portions extended from the body portions to the mounting surface of the capacitor body, to thereby be connected to the connection portions of the external electrodes. The body portions are formed to be spaced apart from virtual lines connecting distal ends of the connection portions and distal ends of the band portions to each other.

7 Claims, 6 Drawing Sheets

(51) Int. Cl.
  *H05K 1/11*      (2006.01)
  *H01G 4/30*      (2006.01)
  *H01G 4/018*     (2006.01)
  *H01G 4/012*     (2006.01)
  *H01G 4/248*     (2006.01)

(52) U.S. Cl.
  CPC .............. *H01G 4/30* (2013.01); *H05K 1/111* (2013.01); *H05K 2201/10015* (2013.01)

(58) Field of Classification Search
  CPC . H01G 4/08; H01G 4/228; H05K 2201/10015
  USPC ........................................... 361/308.1, 306.3
  See application file for complete search history.

(56)           References Cited

U.S. PATENT DOCUMENTS

| | | |
|---|---|---|
| 2013/0294009 A1 | 11/2013 | Takeuchi et al. |
| 2014/0153155 A1* | 6/2014 | Fujii ..................... H01G 4/302 361/301.4 |
| 2014/0160621 A1 | 6/2014 | Yoon et al. |
| 2014/0268488 A1 | 9/2014 | Hattori et al. |

FOREIGN PATENT DOCUMENTS

| | | | |
|---|---|---|---|
| JP | 2013-232606 A | 11/2013 | |
| JP | 2014-199912 A | 10/2014 | |
| KR | 10-2014-0075459 A | 6/2014 | |

* cited by examiner

MULTILAYER CAPACITOR AND BOARD HAVING THE SAME

CROSS-REFERENCE TO RELATED APPLICATION(S)

This application claims the benefit of priority to Korean Patent Application No. 10-2016-0088481, filed on Jul. 13, 2016 in the Korean Intellectual Property Office, the entire disclosure of which is incorporated herein by reference.

BACKGROUND

1. Technical Field

The present disclosure relates to a multilayer capacitor and a board having the same.

2. Description of Related Art

In accordance with recent developments in information technology (IT), performance of an electronic product has been improved, and electronic components have been slimmed.

Therefore, the number of electronic components required in electronic products has tended to be increased, the electronic components have tended to be miniaturized and slimmed, and a thickness of a circuit board on which the electronic components are mounted has tended to be gradually decreased.

A multilayer capacitor, one of a number of multilayer electronic components, is mounted on a circuit board of several electronic products, such as an image device, for example, a liquid crystal display (LCD), a plasma display panel (PDP), and the like, a computer, a personal digital assistant (PDA), a cellular phone, and the like, to serve to charge or discharge electricity therein or therefrom.

In accordance with the miniaturization and slimness of current electronic components, the multilayer capacitors have been manufactured so that dielectric layers have an ultra-thin thickness, but there is a limitation in decreasing the thickness of the dielectric layer in current methods.

Further, as the thickness of the circuit board on which the multilayer capacitor is mounted is decreased, a warpage occurrence rate has further increased, and warpage of the circuit board causes cracks of the multilayer capacitor mounted on the circuit board.

When cracks occur in a 2-terminal multilayer capacitor built according to the related art, the multilayer capacitor does not operate normally but rather operates in a short-circuit state. In severe cases, a large current may flow from a power source to a ground of a circuit board through the multilayer capacitor, such that other electronic components installed in the electronic product, in addition to the multilayer capacitor, may also be burnt.

Therefore, there is a need to develop a multilayer capacitor capable of improving reliability by preventing an occurrence of internal cracks of the multilayer capacitor due to warpage of a circuit board, or allowing the multilayer capacitor to be in an open state, rather than a short-circuit state, even when cracks do occur.

SUMMARY

An aspect of the present disclosure may provide a multilayer capacitor capable of preventing an occurrence of internal cracks of the multilayer capacitor, or preventing a short-circuit defect even in a case of the occurrence of cracks, and a board having the same.

According to an aspect of the present disclosure, a multilayer capacitor includes: external electrodes including connection portions formed on a mounting surface of a capacitor body, and band portions formed on side surfaces of the capacitor body; and internal electrodes including body portions overlapping each other, and lead portions extended from the body portions to the mounting surface of the capacitor body, to thereby be connected to the connection portions of the external electrodes. The body portions are formed to be spaced apart from virtual lines connecting distal ends of the connection portions and distal ends of the band portions to each other. A board having the same is also provided.

BRIEF DESCRIPTION OF DRAWINGS

The above and other aspects, features, and advantages of the present disclosure will be more clearly understood from the following detailed description when taken in conjunction with the accompanying drawings, in which.

DETAILED DESCRIPTION

Figure 1:
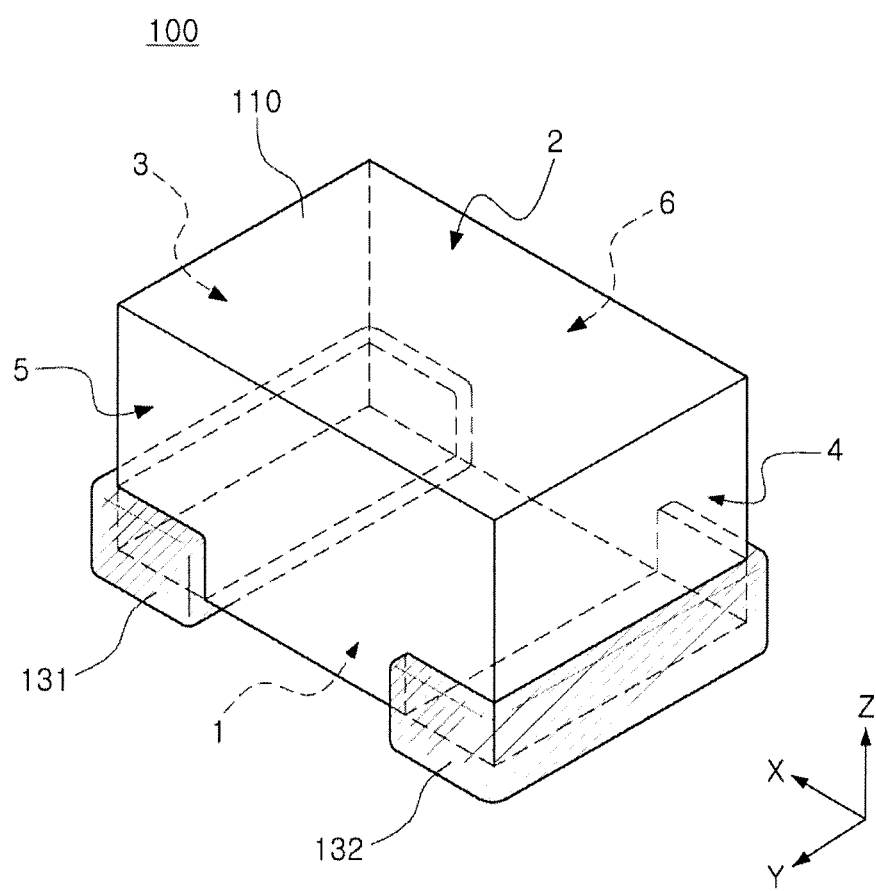
FIG. 1 is a perspective view schematically illustrating a multilayer capacitor according to an exemplary embodiment in the present disclosure.

Hereinafter, exemplary embodiments of the present disclosure will be described in detail with reference to the accompanying drawings.

Directions of a capacitor body will be defined in order to clearly describe exemplary embodiments in the present disclosure. X, Y, and Z, illustrated in the accompanying drawings, refer to a length direction, a width direction, and a thickness direction, respectively. Here, the width direction may be the same as a stacking direction of dielectric layers and internal electrodes.

Further, in the present exemplary embodiment, for convenience of explanation, surfaces of a capacitor body 110 opposing each other in the Z direction will be defined as first and second surfaces 1 and 2, surfaces of the capacitor body 110 opposing each other in the X direction and connecting ends of the first and second surfaces 1 and 2 to each other will be defined as third and fourth surfaces 3 and 4, and surfaces of the capacitor body 110 opposing each other in the Y direction and connecting ends of the first and second surfaces 1 and 2 to each other and connecting ends of the third and fourth surfaces 3 and 4 to each other, respectively, will be defined as fifth and sixth surfaces 5 and 6. Here, the first surface 1 may be the same as a mounting surface.

Multilayer Capacitor

Figure 2:
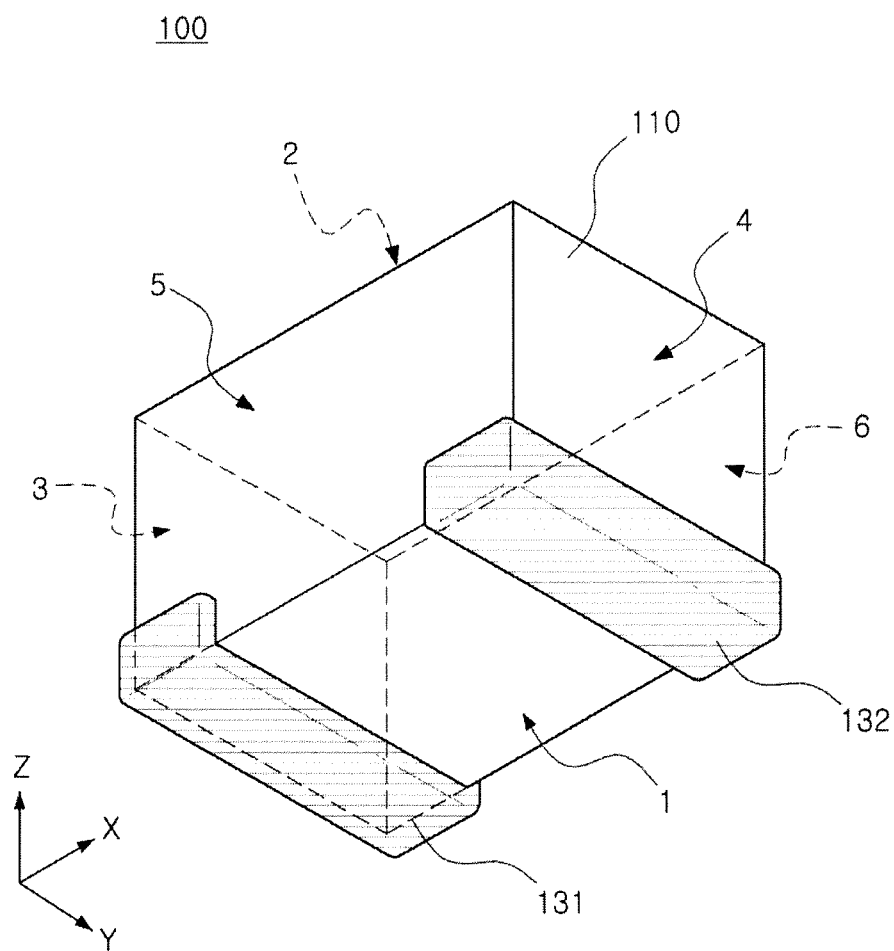
FIG. 2 is a perspective view illustrating the multilayer capacitor of FIG. 1 rotated by 90° so that a mounting surface of a capacitor body is viewed.
Figure 3A:
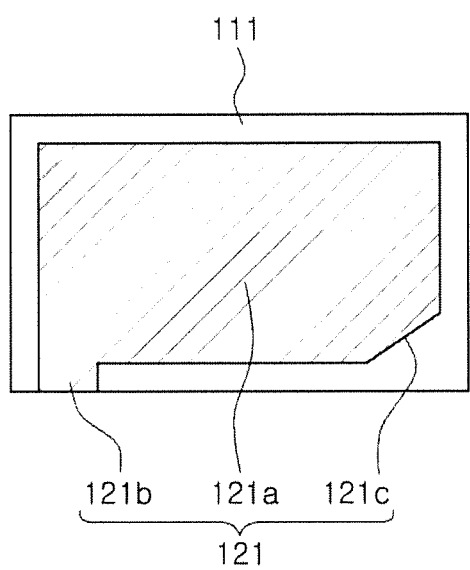
FIGS. 3A and 3B are plan views illustrating first and second internal electrodes of the multilayer capacitor of FIG. 1, respectively.
Figure 3B:
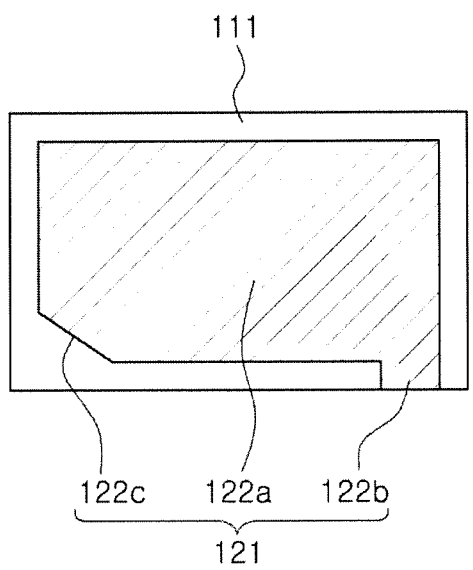
Figure 4:
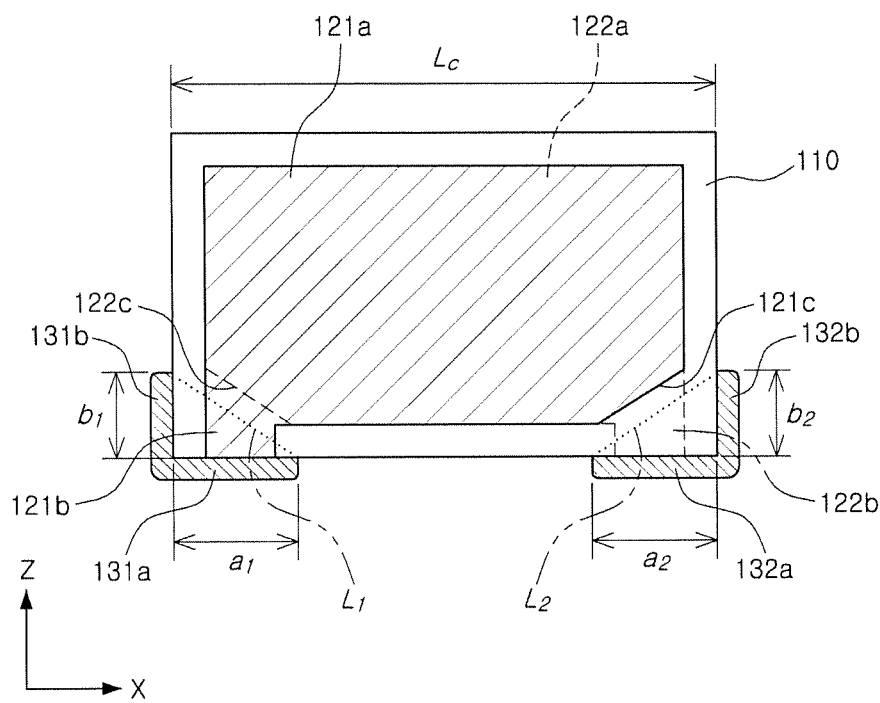
FIGS. 4 and 5 are cross-sectional views of the multilayer capacitor of FIG. 1.
Figure 5:
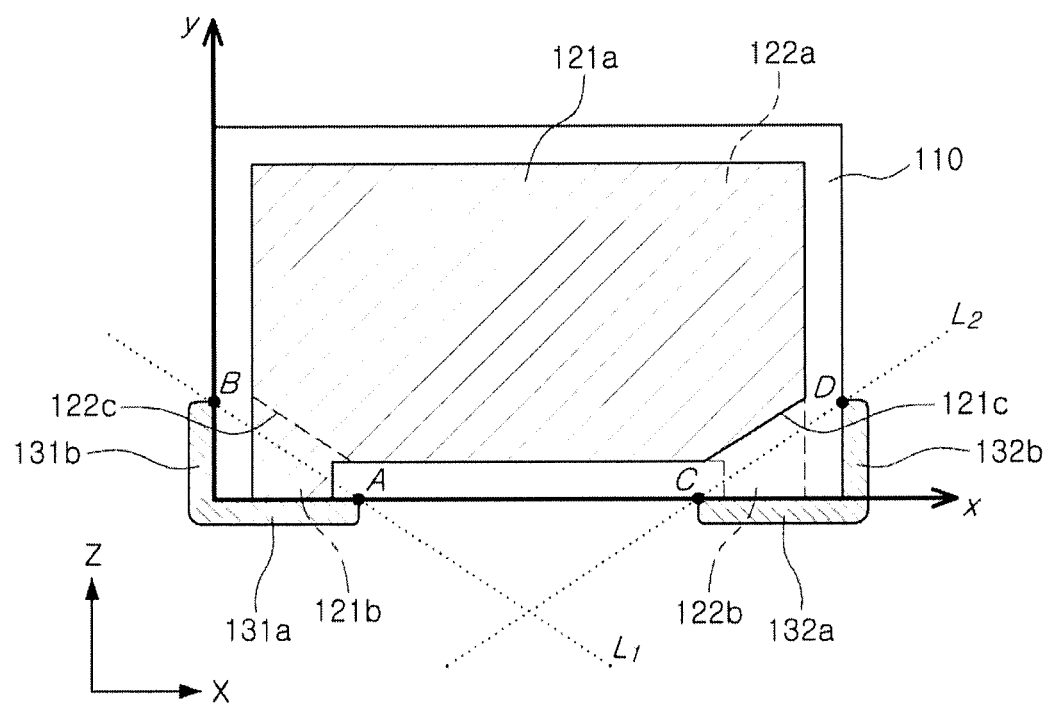

FIG. 1 is a perspective view schematically illustrating a multilayer capacitor according to an exemplary embodiment in the present disclosure, FIG. 2 is a perspective view illustrating the multilayer capacitor of FIG. 1 in a state rotated by 90° so that a mounting surface of a capacitor body is viewed, FIGS. 3A and 3B are plan views illustrating first and second internal electrodes of the multilayer capacitor of FIG. 1, respectively, and FIGS. 4 and 5 are cross-sectional views of the multilayer capacitor of FIG. 1.

Referring to FIGS. 1 through 5, a multilayer capacitor 100 according to an exemplary embodiment in the present disclosure may include a capacitor body 110 including dielectric layers 111 and first and second internal electrodes 121 and 122, and first and second external electrodes 131 and 132.

The capacitor body 110 may be formed by stacking a plurality of dielectric layers 111, and may have an approximately hexahedral shape, as illustrated, but the shape of the capacitor body 110 is not particularly limited thereto.

Here, the shape and a dimension of the capacitor body 110 and the number of stacked dielectric layers 111 are not limited to those illustrated in the accompanying drawings.

In addition, the dielectric layers 111 may be in a sintered state, and adjacent dielectric layers 111 may be integrated with each other so that boundaries therebetween are not readily apparent without a scanning electron microscope (SEM).

The capacitor body 110 as described above may include an active region including the first and second internal electrodes 121 and 122 as parts contributing to form capacitance of the capacitor, and cover regions disposed on both sides of the active region as margin portions.

The active region may be formed by repeatedly stacking a plurality of first and second internal electrodes 121 and 122, with each of the dielectric layers 111 interposed therebetween in the Y direction.

Here, a thickness of the dielectric layer 111 may be arbitrarily altered, depending on a capacitance design of the multilayer capacitor 100.

In addition, the dielectric layer 111 may contain ceramic powders having high permittivity, for example, barium titanate ($BaTiO_3$)-based powders or strontium titanate ($SrTiO_3$)-based powders. However, a material of the dielectric layer 111 is not limited thereto.

Further, the dielectric layer 111 may further contain at least one of ceramic additives, organic solvents, plasticizers, binders, dispersants, and the like, in addition to the ceramic powders.

The cover regions may be formed of the same material as that of the dielectric layers and have the same configuration as that of the dielectric layer 111, except that the cover regions are positioned on both sides of the active region in the Y direction and do not include the internal electrodes.

The cover regions may be prepared by stacking a single or two or more dielectric layers 111 in both outer sides of the active region in the Y direction, respectively, and may serve to prevent the first and second internal electrodes 121 and 122 from being damaged by physical or chemical stress.

The first and second internal electrodes 121 and 122 may be electrodes having different polarities from each other.

The first and second internal electrodes 121 and 122 may be alternately disposed in the capacitor body 110, with each of the dielectric layers 111 interposed therebetween in the Y direction, may be formed by printing a conductive paste containing a conductive metal on the dielectric layer 111 at a predetermined thickness, and may be electrically insulated from each other by the dielectric layer 111 interposed therebetween.

The conductive metal contained in the conductive paste may be, for example, nickel (Ni), copper (Cu), palladium (Pd), or an alloy thereof. However, the conductive metal contained in the conductive paste is not limited thereto.

In addition, a method of printing the conductive paste may be a screen printing method, a gravure printing method, or the like. However, the method of printing the conductive paste according to the present disclosure is not limited thereto.

The first and second internal electrodes 121 and 122 according to the present exemplary embodiment may be formed to be exposed to the first surface 1 of the capacitor body 110, which is the mounting surface of the capacitor body 110.

Here, an overlapping area between the first and second internal electrodes 121 and 122 in the Y direction may be associated with the capacitance of the capacitor.

According to the present exemplary embodiment, the first internal electrode 121 may include a first body portion 121a and a first lead portion 121b, extended from the first body portion 121a to be exposed to the first surface 1 of the capacitor body 110.

The second internal electrode 122 may include a second body portion 122a overlapping the first body portion 121a in the Y direction, and a second lead portion 121b, extended from the second body portion 122a to be exposed to the first surface 1 of the capacitor body 110. Here, the first and second lead portions 121b and 122b may be spaced apart from each other in the X direction.

The first and second internal electrodes 121 and 122 as described above may be formed of a conductive paste containing a conductive metal.

The conductive metal may be, for example, silver (Ag), platinum (Pt), nickel (Ni), copper (Cu), palladium (Pd), or an alloy thereof, but is not limited thereto.

The first external electrode 131 may include a first connection portion 131a and a first band portion 131b.

The first connection portion 131a may be formed on the first surface 1 of the capacitor body 110, and contact exposed portions of the first lead portions 121b, to thereby electrically connect the plurality of first internal electrodes 121 stacked in the Y direction to each other.

The first band portion 131b may be a portion extended from the first connection portion 131a to portions of the third, fifth, and sixth surfaces 3, 5, and 6 of the capacitor body 110, respectively.

The second external electrode 132 may include a second connection portion 132a and a second band portion 132b.

The second connection portion 132a may be formed on the first surface 1 of the capacitor body 110, to be spaced apart from the first connection portion 131a in the X direction, and contact exposed portions of the second lead portions 122b, to thereby electrically connect the plurality of second internal electrodes 122 stacked in the Y direction to each other.

The second band portion 132b may be a portion extended from the second connection portion 132a to portions of the fourth, fifth, and sixth surfaces 4, 5, and 6 of the capacitor body 110, respectively.

The first and second external electrodes 131 and 132 as described above may be formed of a conductive paste including a conductive metal.

The conductive metal may be, for example, nickel (Ni) copper (Cu), palladium (Pd), gold (Au), or an alloy thereof, but is not limited thereto.

Further, if necessary, plating layers may be further formed on the first and second external electrodes 131 and 132.

The plating layer may be used to increase adhesion strength between the multilayer capacitor 100 and a circuit board when the multilayer capacitor 100 is mounted on the circuit board using solders.

Meanwhile, in a case in which a conductive resin structure is further added to the first and second external electrodes 131 and 132, bending strength may be further increased, such that reliability of the multilayer capacitor may be further improved.

Further, the first body portion 121a of the first internal electrode 121 may be formed to be spaced apart from a second virtual line L2, connecting a distal end of the second connection portion 132a of the second external electrode 132 and a distal end of the second band portion 132b to each other.

Therefore, one edge 121c of the first body portion 121a may be formed to be parallel with the second virtual line L2 connecting the distal end of the second connection portion 132a and the distal end of the second band portion 132b to each other.

The second body portion 122a of the second internal electrode 122 may be formed to be spaced apart from a first virtual line L1, connecting a distal end of the first connection portion 131a of the first external electrode 131 and a distal end of the first band portion 131b to each other.

Therefore, one edge 122c of the second body portion 122a may be formed to be parallel with the first virtual line L1 connecting the distal end of the first connection portion 131a and the distal end of the first band portion 131b to each other.

The multilayer capacitor 100 according to the present exemplary embodiment may have a lower surface mounting structure in which both the first and second lead portions 121b and 122b are exposed to the first surface 1 of the capacitor body 110, the mounting surface of the capacitor body 110; and the first surface 1 of the capacitor body 110 becomes the mounting surface, and thus equivalent series inductance (ESL) of the multilayer capacitor 100 may be decreased by decreasing a current path at the time of applying a voltage thereto.

Cracks of a multilayer capacitor may occur as a result of applied tensile stress, due to warpage of a circuit board at a portion on which solder of a capacitor body is formed.

These cracks may occur mainly from a mounting surface of the multilayer capacitor to a side surface thereof, and occur from a distal end of a lower band portion of an external electrode to the highest point of the solder formed on the side surface of the capacitor body.

In a 2-terminal multilayer capacitor according to the related art, a short-circuit between internal electrodes disposed in a capacitor body may occur along a crack propagation path.

As a method for solving this problem, it is possible to dispose a conductive resin layer, in which a metal and a resin are bound to each other between a conductive layer formed of copper and a plating layer formed of nickel in external electrodes, to buffer external force due to warpage of a circuit board, using the conductive resin layer.

However, this method has an effect only when the external force due to the warpage of the circuit board is less than a predetermined level, and, in a case in which warpage of the circuit board occurs excessively, the effect is insufficient, such that there is still a possibility of a short-circuit due to the occurrence of cracks.

Further, since the conductive resin layer may have a large resistance, the conductive resin layer may cause an increase in equivalent series resistance (ESR) of the multilayer capacitor.

In the multilayer capacitor according to the present exemplary embodiment, the first and second lead portions 121b and 122b of the first and second internal electrodes 121 and 122 may be exposed to the mounting surface 1 of the capacitor body 110, and the first and second external electrodes 131 and 132 may be formed on the first surface 1 of the capacitor body 110, such that at the time of mounting the multilayer capacitor 100 on the circuit board, a height of the solder may be decreased.

In addition, the first and second body portions 121a and 122a of the first and second internal electrodes 121 and 122, overlapping each other, may be formed not to contact the second and first virtual lines L2 and L1, connecting the distal ends of the second and first connection portions 132a and 131a of the second and first external electrodes 132 and 131 and the distal ends of the second and first band portions 132b and 131b to each other, respectively.

Therefore, even in a case that warpage cracks occur in the capacitor body 110, since the crack propagation path does not meet an overlapping region between the first and second body portions 121a and 122a, a short-circuit may be prevented.

Board Having Multilayer Capacitor

Figure 6:
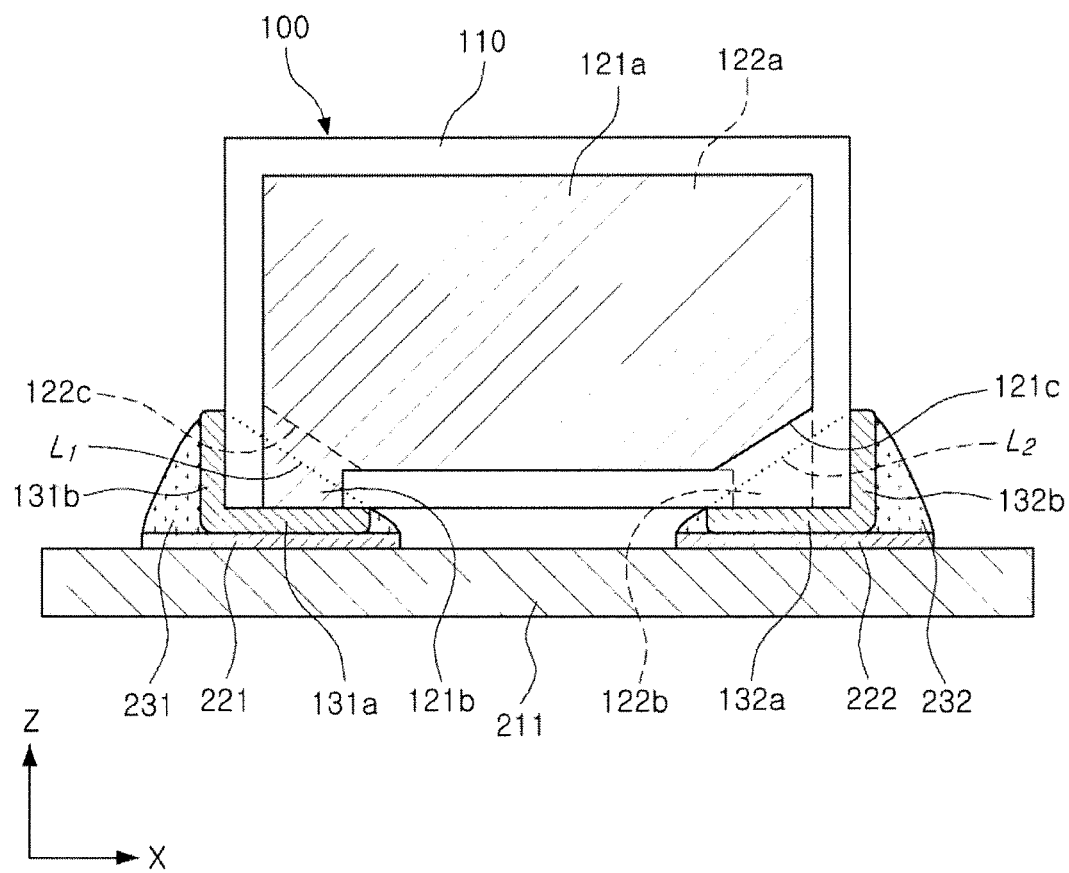
FIG. 6 is a cross-sectional view illustrating a board in which the multilayer capacitor of FIG. 1 is mounted on a circuit board.

Referring to FIG. 6, a board 1000, having a multilayer capacitor according to the present exemplary embodiment, may include a circuit board 211, on which the multilayer capacitor 100 is mounted, and first and second electrode pads 221 and 222 disposed on an upper surface of the circuit board 211 to be spaced apart from each other.

The multilayer capacitor 100 may be fixed and electrically connected to the circuit board 211 by solders 231 and 232 in a state in which the first and second external electrodes 131 and 132 are positioned to contact the first and second electrode pads 221 and 222, respectively.

Here, the first body portion 121a of the first internal electrode 121 of the multilayer capacitor 100 may be formed to be spaced apart from a virtual line L2, connecting the highest point of the solder 232 formed on the second band portion 132b of the second external electrode 132, and the highest point of the solder 232 formed adjacent to the second connection portion 132a and disposed under the mounting surface of the multilayer capacitor 100, to each other.

The second body portion 122a of the second internal electrode 122 of the multilayer capacitor 100 may be formed to be spaced apart from a virtual line L1, connecting the highest point of the solder 231 formed on the first band portion 131b of the first external electrode 131, and the highest point of the solder 231 formed adjacent to the first connection portion 131a and disposed under the mounting surface of the multilayer capacitor 100, to each other.

Therefore, even in a case that warpage cracks occur in the capacitor body 110, since the crack propagation path does not meet an overlapping region between the first and second body portions 121a and 122a, an open defect may occur instead of a short-circuit.

Experimental Example

The following Table 1 illustrates bending strength and adhesion strength, depending on a shape of external electrodes in a multilayer capacitor according to an exemplary embodiment in the present disclosure.

Here, the multilayer capacitor was set to have a size of 2.0 mm*1.2 mm (length*width), the bending strength was judged based on a capacitance change rate of 10% at the time of bending a board, in which the multilayer capacitor was mounted, by 5 mm for 60 seconds, and the adhesion strength was judged based on whether or not a short-circuit occurred between electrode pads of the circuit board and the external electrodes of the multilayer capacitor at the time of applying a force of 5N thereto for 10 seconds. In each case, the number of tested samples was 100.

TABLE 1

| No. | a1 (μm) | a2 (μm) | b1 (μm) | b2 (μm) | Bending Strength | Adhesion Strength |
|---|---|---|---|---|---|---|
| 1 | 415 | 408 | 0 | 0 | OK | NG |
| 2 | 407 | 411 | 15 | 17 | OK | OK |
| 3 | 421 | 412 | 52 | 47 | OK | OK |
| 4 | 418 | 407 | 92 | 90 | OK | OK |
| 5 | 412 | 405 | 134 | 131 | OK | OK |
| 6 | 415 | 412 | 157 | 155 | OK | OK |
| 7 | 408 | 413 | 188 | 192 | OK | OK |
| 8 | 404 | 414 | 222 | 219 | NG | OK |

In Table 1, a1 and a2 indicate widths of first and second connection portions formed on a first surface of a capacitor body, respectively, and b1 and b2 indicate heights of first and second band portions formed on third and fourth surfaces of the capacitor body, respectively.

Referring to Table 1, in sample 1 in which the external electrodes were formed only of the connection portions without the band portions, an adhesion strength defect occurred.

Further, in sample 8, in which b1 and b2 were larger than 192 μm, a bending strength defect occurred.

That is, it may be appreciated that when the height of the band portion is increased and thus a height of a solder is increased, adhesion strength may be improved, but force applied by the solder may be increased, which is disadvantageous in relation to bending strength.

Further, in samples 2 to 7, in which b1 and b2 were in a range of 15 μm to 192 μm, there was no bending strength defect or adhesion strength defect.

Therefore, a height of the band portion of the external electrode, at which the bending strength defect and adhesion strength defect do not occur, may be 15 μm to 192 μm.

Meanwhile, in a case in which the following conditions are satisfied, even in a case that warpage cracks occur due to excessive warpage, since an open defect may occur rather than the short-circuit, a negative influence of an over-current by the short-circuit at the time of the occurrence of cracks on other components in the related art may be removed.

Referring to FIGS. 4 and 5, in a case in which arbitrary points x and y in the overlapping region between the first and second body portions 121a and 122a satisfy the following Equations 1 and 2, an open defect capable of preventing the short-circuit by the warpage crack may occur.

Equation 1 is a function for a virtual line L1, Equation L2 is a function for a virtual line 2, and Lc is a length of the capacitor body.

$$y > -(b1/a1)x + b1 \quad \text{(Equation 1)}$$

$$y > (b2/a2)x + b2(1-(Lc/a2)) \quad \text{(Equation 2)}$$

As set forth above, according to exemplary embodiments in the present disclosure, the body portion of the internal electrode may be formed to be spaced apart from a virtual line connecting the distal end of the connection portion of the external electrode and the distal end of the band portion to each other, such that cracks of the capacitor body may be significantly decreased, and, even in the case that cracks occur in the capacitor body as a result of the warpage defect, the capacitor body may be allowed to be in an open state rather than the short-circuit state, such that reliability of a product may be improved.

While exemplary embodiments have been shown and described above, it will be apparent to those skilled in the art that modifications and variations could be made without departing from the scope of the present invention, as defined by the appended claims.

What is claimed is:

1. A multilayer capacitor comprising:
   a capacitor body including dielectric layers and first and second internal electrodes alternately disposed, with at least one of the dielectric layers interposed therebetween;
   a first external electrode including a first connection portion disposed on a mounting surface of the capacitor body, and a first band portion extending from the first connection portion and disposed on only a portion of a side surface of the capacitor body; and
   a second external electrode including a second connection portion disposed on the mounting surface of the capacitor body to be spaced apart from the first connection portion, and a second band portion extending from the second connection portion and disposed on only a portion of a side surface of the capacitor body,
   wherein the first internal electrode includes a first body portion and a first lead portion extending from the first body portion to the mounting surface of the capacitor body, to thereby be connected to the first connection portion, and
   the second internal electrode includes a second body portion overlapping the first body portion and a second lead portion extending from the second body portion to the mounting surface of the capacitor body, to thereby be connected to the second connection portion,
   the first body portion being spaced apart from a virtual line connecting a distal end of the second connection portion and a distal end of the second band portion to each other, and
   the second body portion being spaced apart from a virtual line connecting a distal end of the first connection portion and a distal end of the first band portion to each other,
   a first edge of the first body portion is parallel with the virtual line connecting the distal end of the second connection portion and the distal end of the second band portion to each other,
   a first edge of the second body portion is parallel with the virtual line connecting the distal end of the first connection portion and the distal end of the first band portion to each other,
   a second edge of the first body portion is disposed closer to the mounting surface than an upper edge of the second band portion, and
   a second edge of the second body portion is disposed closer to the mounting surface than an upper edge of the first band portion.

2. The multilayer capacitor body of claim 1, wherein a height of each of the first and second band portions is within a range of 15 μm to 192 μm.

3. The multilayer capacitor of claim 1, wherein y>−(b1/a1)x+b1 (Equation 1) and y>(b2/a2)x+b2(1−(Lc/a2)) (Equation 2), in which a1 and a2 are widths of the first and second connection portions formed on the mounting surface of the capacitor body, respectively, b1 and b2 are heights of the first and second band portions formed on side surfaces of the capacitor body, respectively, Lc is a length of the capacitor body, and x and y are respectively an x coordinate and a y coordinate of a point located in an overlapping region between the first body portion and the second body portion, based on a corner of the capacitor body on which the first external electrode is formed.

4. The multilayer capacitor of claim 1, wherein the first and second internal electrodes are disposed to be perpendicular to the mounting surface of the multilayer capacitor.

5. A board having a multilayer capacitor, the board comprising:
a circuit board having an upper surface on which first and second electrode pads are formed;
the multilayer capacitor of claim 1, mounted on the circuit board so that the first and second connection portions are positioned on the first and second electrode pads of the circuit board; and
solders connecting the first and second external electrodes of the multilayer capacitor and the first and second electrode pads, respectively.

6. The board of claim 5, wherein the first body portion is spaced apart from a virtual line connecting the highest point of the solder formed on the second band portion, and the highest point of the solder formed adjacent to the second connection portion and disposed under the mounting surface of the multilayer capacitor, to each other, and
the second body portion is spaced apart from a virtual line connecting the highest point of the solder formed on the first band portion, and the highest point of the solder formed adjacent to the first connection portion and disposed under the mounting surface of the multilayer capacitor, to each other.

7. The board of claim 6, wherein an edge of the first body portion is parallel with the virtual line connecting the highest point of the solder formed on the second band portion, and the highest point of the solder formed adjacent to the second connection portion and disposed under the mounting surface of the multilayer capacitor, to each other, and
an edge of the second body portion is parallel with the virtual line connecting the highest point of the solder formed on the first band portion, and the highest point of the solder formed adjacent to the first connection portion and disposed under the mounting surface of the multilayer capacitor, to each other.

* * * * *